(12) United States Patent
Mirzaei et al.

(10) Patent No.: US 7,852,147 B1
(45) Date of Patent: Dec. 14, 2010

(54) AUTOCALIBRATED CONTROLLED MOS SWITCHES AND APPLICATIONS THEREOF

(75) Inventors: Ahmad Mirzaei, Costa Mesa, CA (US); Amir Hadji-Abdolhamid, Laguna Beach, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/500,306

(22) Filed: Jul. 9, 2009

(51) Int. Cl.
*H03K 5/00* (2006.01)
(52) U.S. Cl. ...................... 327/553; 327/552
(58) Field of Classification Search .......... 327/551–559
See application file for complete search history.

(56) References Cited

U.S. PATENT DOCUMENTS

| | | | |
|---|---|---|---|
| 4,494,551 A * | 1/1985 | Little et al. ................. | 600/509 |
| 6,873,206 B1 * | 3/2005 | Hildebrant et al. ........... | 327/560 |
| 7,005,929 B2 * | 2/2006 | Smith ........................ | 331/17 |
| 7,471,140 B2 * | 12/2008 | Salerno ...................... | 327/551 |

* cited by examiner

*Primary Examiner*—Dinh T. Le
(74) *Attorney, Agent, or Firm*—Sterne, Kessler, Goldstein & Fox P.L.L.C.

(57) ABSTRACT

An integrated circuit includes a signal-path filter, a high-pass filter, and a control circuit. The signal-path filter is configured to receive an input signal and provide an output signal. The high-pass filter is coupled to the signal-path filter and is configured to reduce a direct-current (DC) component of the input signal. The high-pass filter includes a metal-oxide-semiconductor (MOS) switch, wherein a corner frequency of the high-pass filter is based on a resistance of the MOS switch. The control circuit is configured to provide a control voltage to the MOS switch. The control circuit includes a reference resistor, wherein the resistance of the MOS switch substantially tracks the resistance of the reference resistor. The integrated circuit may be embodied in software and/or included in a device (e.g., a mobile telephone) that receives and filters a signal.

18 Claims, 11 Drawing Sheets

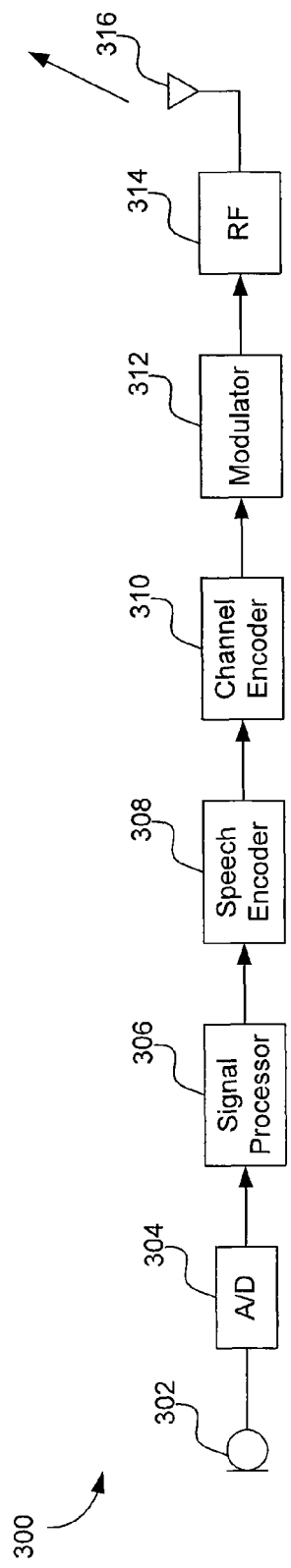
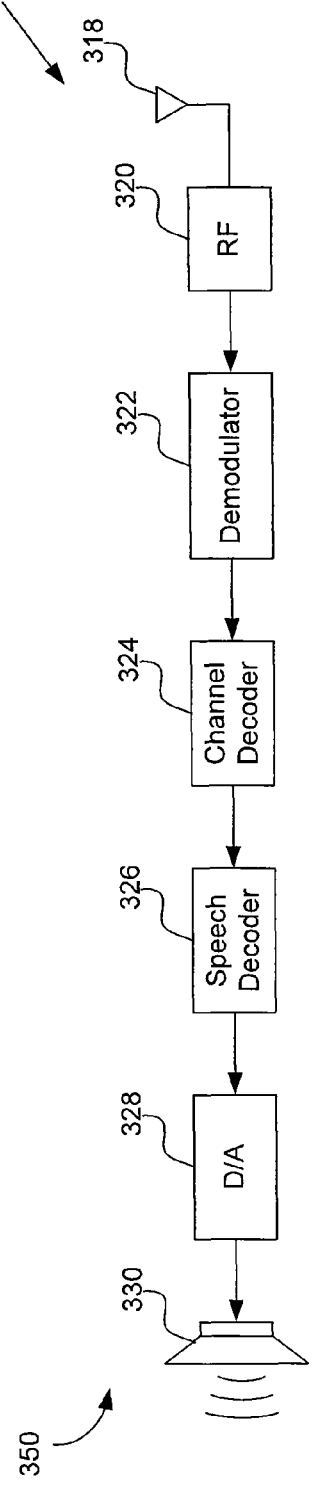
FIG. 3A
FIG. 3B

US 7,852,147 B1

AUTOCALIBRATED CONTROLLED MOS SWITCHES AND APPLICATIONS THEREOF

BACKGROUND OF THE INVENTION

1. Field of the Invention

The present invention is generally directed to integrated-circuit (IC) designs. More particularly, the present invention is directed to area-reducing IC designs for use in devices (e.g., mobile telephones).

2. Background Art

Mobile telephones typically transmit and receive radio-frequency (RF) signals, but internally process lower-frequencies signals. To internally process low-frequency signals while transmitting and receiving RF signals, a mobile telephone includes circuitry to convert signals from low to high frequencies and vice versa. For example, in a transmit path of a typical mobile telephone, a voice signal is encoded at a relatively low frequency and then an RF-conversion circuit converts the encoded voice signal into an RF signal for transmission. In a receive path, a typical mobile telephone includes another RF-conversion circuit to convert a received RF signal into a lower frequency before being decoded and provided in an audible form to a user. The RF-conversion circuits in the transmit and receive paths may be included in a single IC (chip) or may be divided into separate ICs (chips).

An RF-conversion circuit in a receive path of a mobile telephone typically includes a plurality of different filters that are used during conversion of an RF signal to a lower-frequency signal. For example, FIG. 1 illustrates a plurality of example filters, including a first filter 110A through an N-th filter 110N. Each filter 110 includes a signal-path filter 102 and a feedback loop 104. Signal-path filter 102 filters an input signal to provide an output signal. Feedback loop 104 provides some type of secondary filtering, such as direct-current (DC) cancellation.

In conventional RF-conversion circuits, the filters may include large-sized resistors with good accuracy. For example, conventional mobile-telephone receivers (such as, wideband code division multiple access (WCDMA) receivers, GSM receivers, or the like) include a two-stage baseband filter. FIG. 2 illustrates an example first stage of such a two-stage baseband filter. As shown in FIG. 2, the signal path 102 is configured to filter an input signal and includes resistors $R_1$ and $R_f$ which are relatively small (e.g., approximately 2.4 k$\Omega$ to approximately 24 k$\Omega$). The feedback loop 104 is configured as a high-pass filter—which causes feedback loop 104 to function as a DC-cancellation loop because any DC component at the output is collected into feedback loop 104 and is subtracted from the input. The cut-off frequency of this high-pass filter is inversely proportional to resistors $R_{1hp}$ included in DC-cancellation loop 104. Typically, the cut-off frequency is relatively low, meaning that resistors $R_{1hp}$ are relatively large (e.g., approximately 2 M$\Omega$). Due to their large size, resistors $R_{1hp}$ of DC-cancellation loop 104 occupy a large percentage of the chip area (e.g., approximately 20% in conventional designs). Resistors that consume a large percentage of chip area are undesirable.

One potential solution for reducing the area occupied by the resistors of DC-cancellation loop 104 is to use n-well sheet resistors because these resistors have a smaller area footprint compared to other types of resistor. Unfortunately, n-well sheet resistors have relatively low accuracy compared to other types of resistors. Due to their relatively low accuracy, n-well sheet resistors typically should not be used in filters that require high accuracy, such as in signal-path filter 102. Although a feedback loop (like DC-cancellation loop 104) typically does not require high-accuracy resistors, the resistors of DC-cancellation loop 104 should be of the same type as signal-path filter 102 to provide a well-defined high-pass cut-off frequency. Accordingly, because n-well sheet resistors should not be used in signal-path filter 102, n-well sheet resistors should also not be used in DC-cancellation loop 104.

Given the foregoing, what is needed is a filter having a smaller area footprint compared to conventional filters, and applications thereof.

BRIEF SUMMARY OF THE INVENTION

The present invention meets the above-described needs by providing a filter having controlled metal-oxide-semiconductor (MOS) switches and applications thereof. The controlled MOS switches enable an overall area reduction of the filter compared to filters having bulky resistors, without substantially effecting the performance (e.g., power consumption) of the filter.

For example, an embodiment of the present invention provides an integrated circuit that includes a signal-path filter, a high-pass filter, and a control circuit. The signal-path filter is configured to receive an input signal and provide an output signal. The high-pass filter is coupled to the signal-path filter and is configured to reduce a direct-current (DC) component of the input signal. The high-pass filter includes a metal-oxide-semiconductor (MOS) switch, wherein a corner frequency of the high-pass filter is based on a resistance of the MOS switch. The control circuit is configured to provide a control voltage to the MOS switch. The control circuit includes a reference resistor, wherein the resistance of the MOS switch substantially tracks the resistance of the reference resistor.

In another embodiment, the integrated circuit is included in a device (e.g., a mobile telephone) that receives a signal to be filtered.

In a further embodiment, the integrated circuit is defined in software. In this embodiment, a computer-program product includes a computer-readable storage medium containing instructions, which if executed on a computing device, define the integrated circuit.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 3A and 3B respectively illustrate an example transmit path and an example receive path of a mobile telephone in accordance with an embodiment of the present invention.

Figure 4:
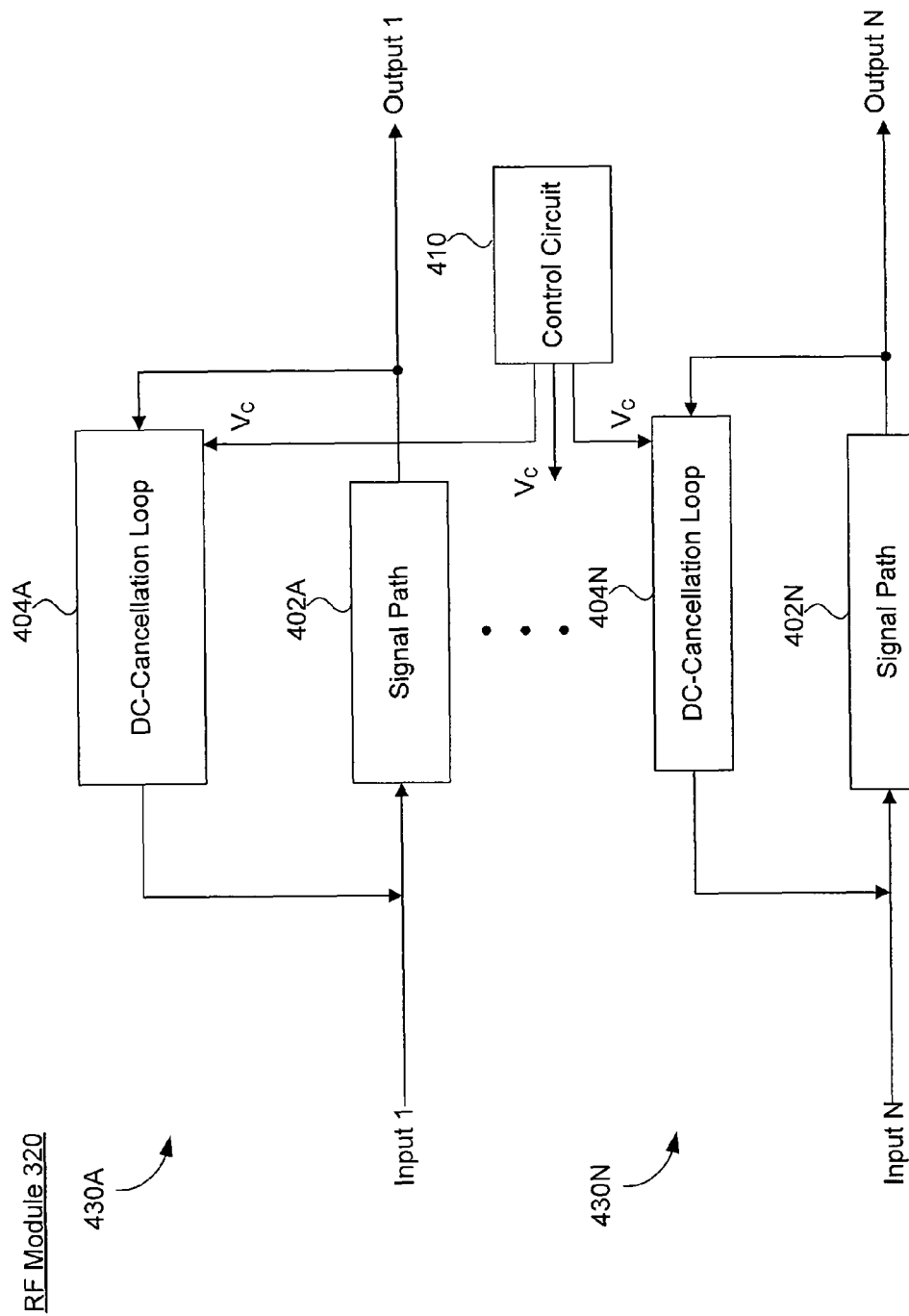

FIG. 4 is a diagram of an example RF filter comprising a plurality of signal-path filters and a plurality of high-pass filters, wherein a control circuit provides a control voltage to a MOS switch included in each high-pass filter in accordance with an embodiment of the present invention.

Figure 1:
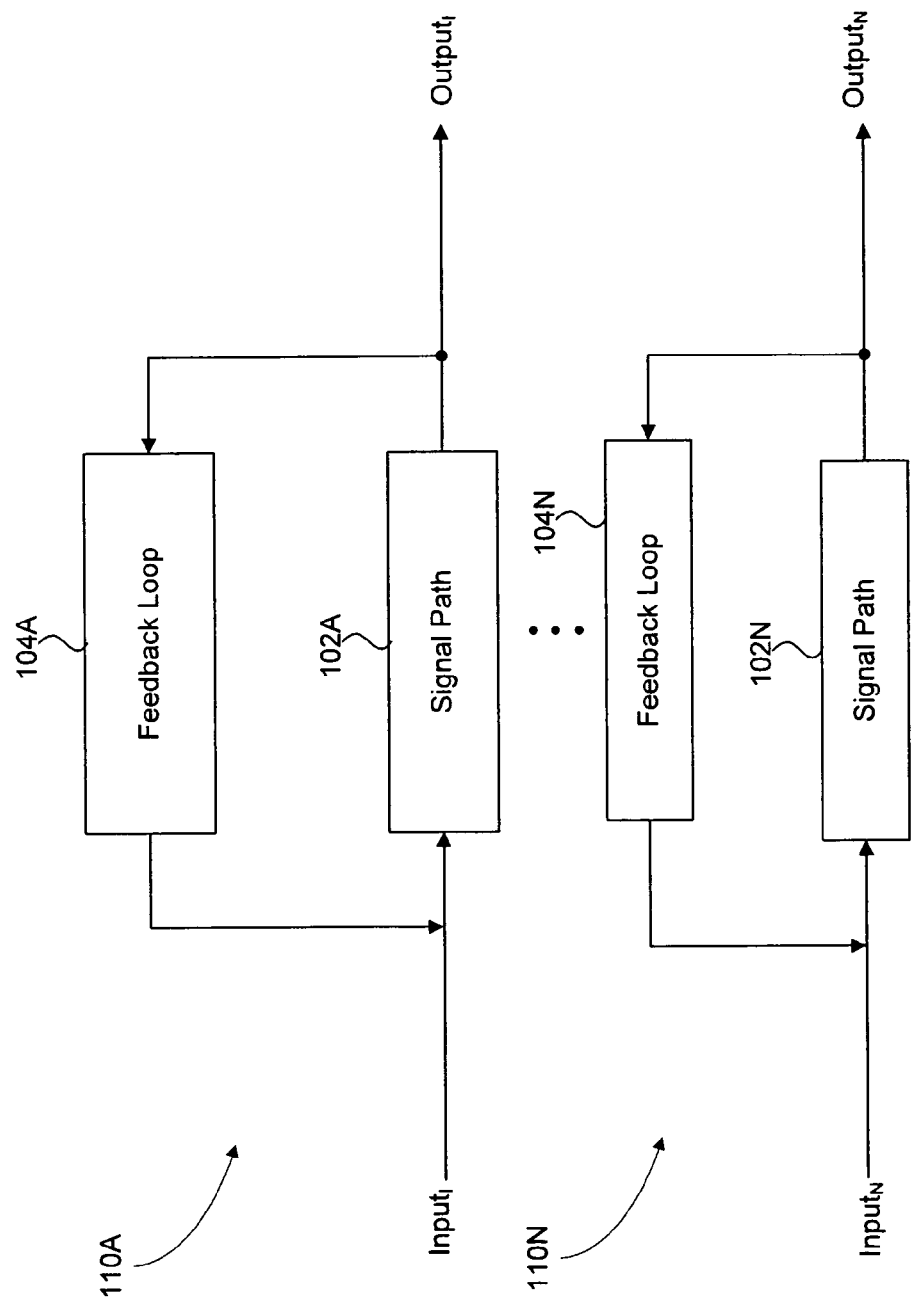
FIG. 1 is a diagram of an example filter included in the receive path of the mobile telephone, wherein the filter includes a signal-path filter and a high-pass filter.
Figure 2:
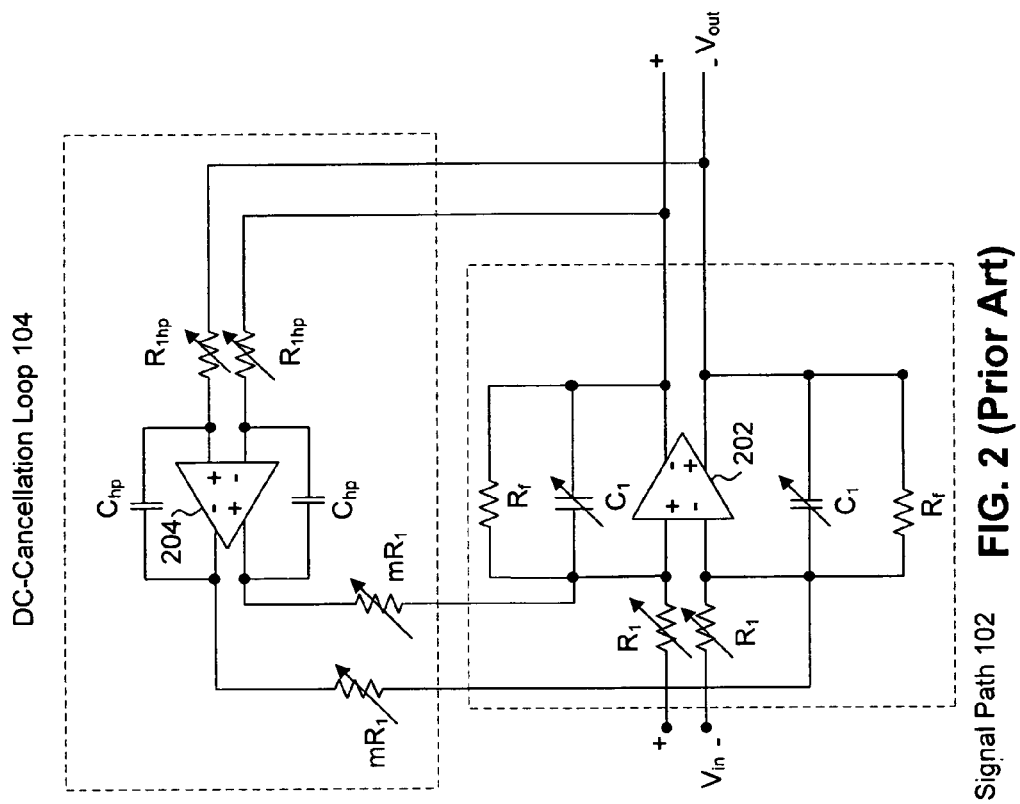
FIG. 2 is a diagram of a conventional high-pass filter included in the filter of FIG. 1, wherein the conventional high-pass filter includes one or more large-sized resistors.
Figure 5:
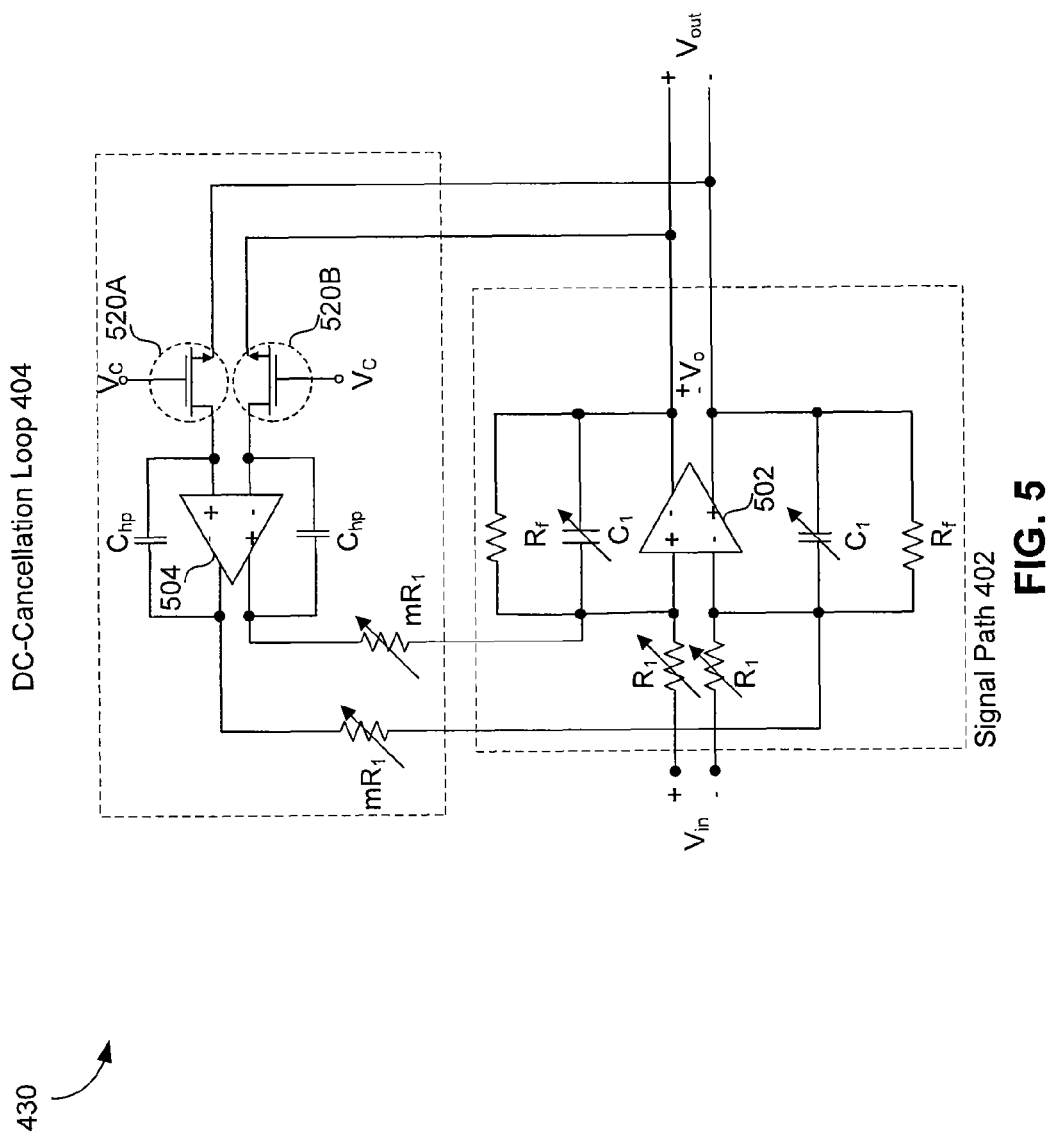

FIG. 5 is a diagram of an example high-pass filter of FIG. 4 in accordance with an embodiment of the present invention, wherein the one or more large-sized resistors of the conventional high-pass filter of FIG. 2 are replaced with one or more MOS switches.

Figure 6:
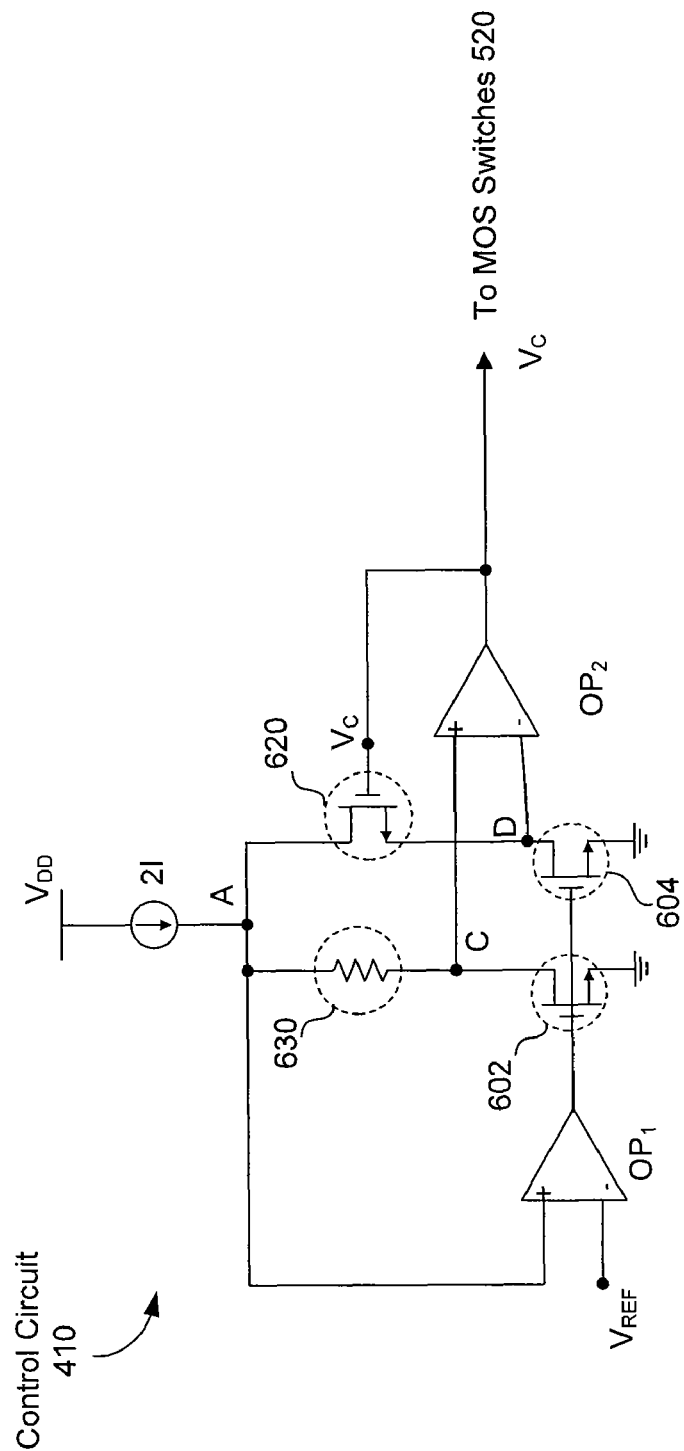

FIG. 6 is a diagram of a first embodiment of the control circuit of FIG. 4.

Figure 7:
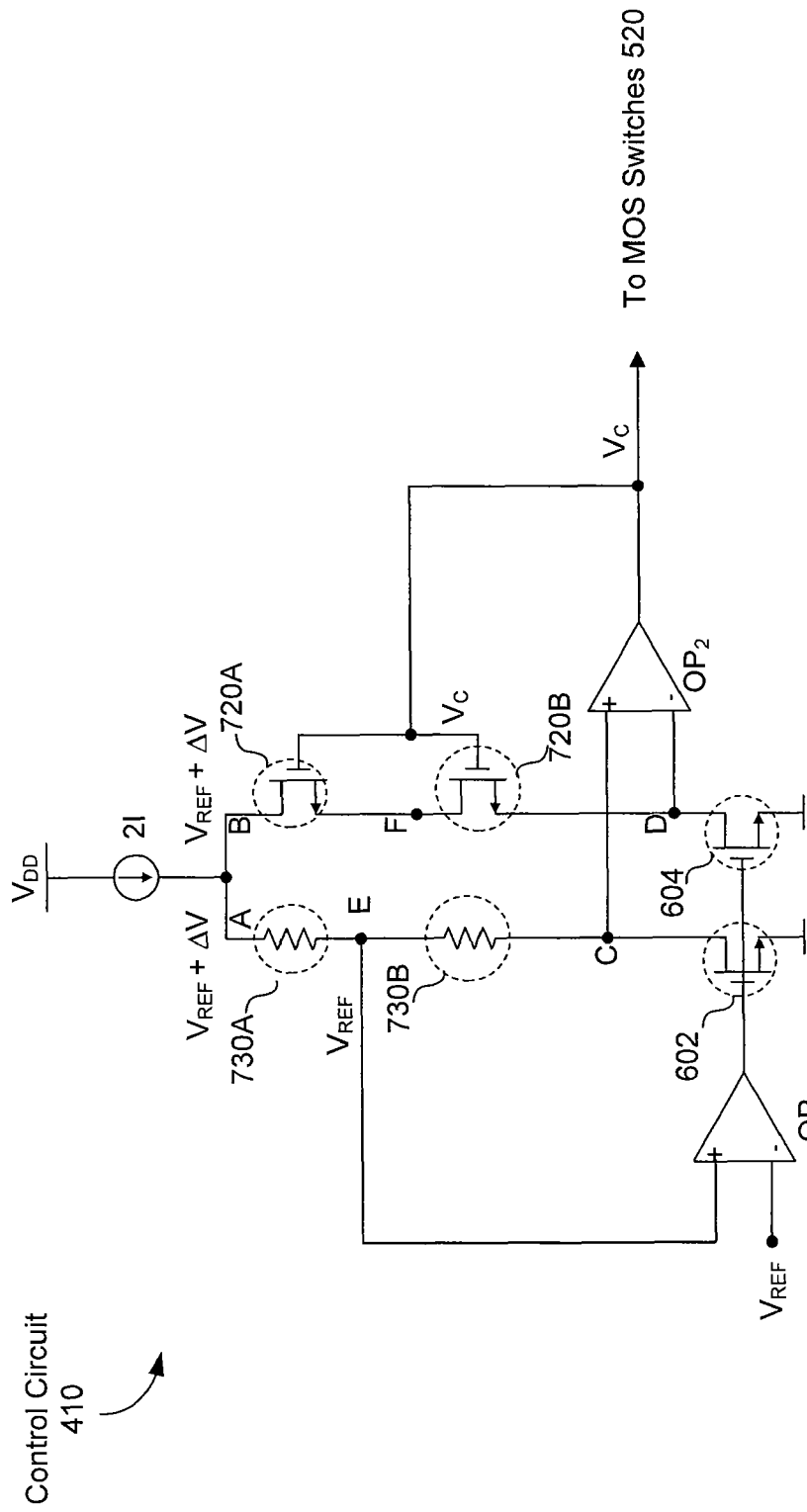

FIG. 7 is a diagram of a second embodiment of the control circuit of FIG. 4.

Figure 8A:
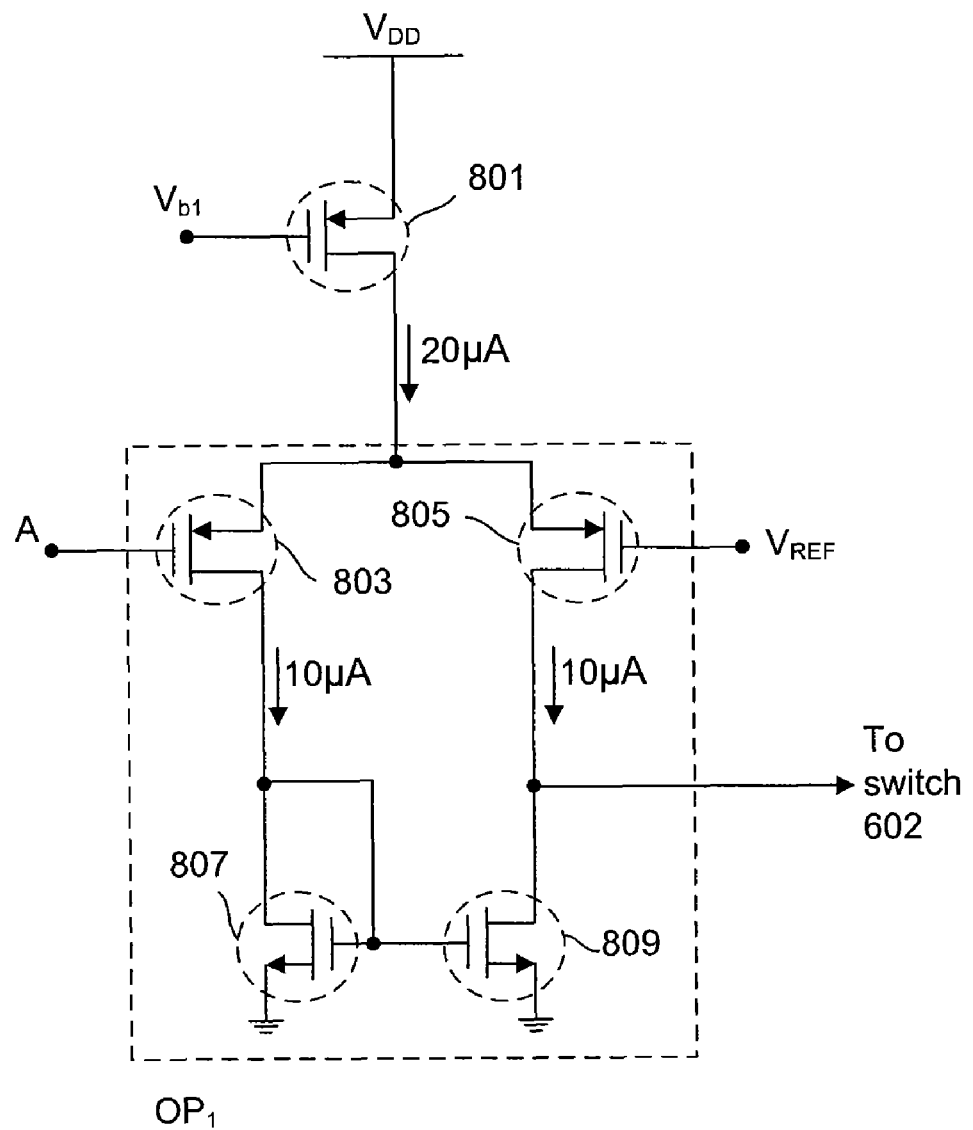
Figure 8B:
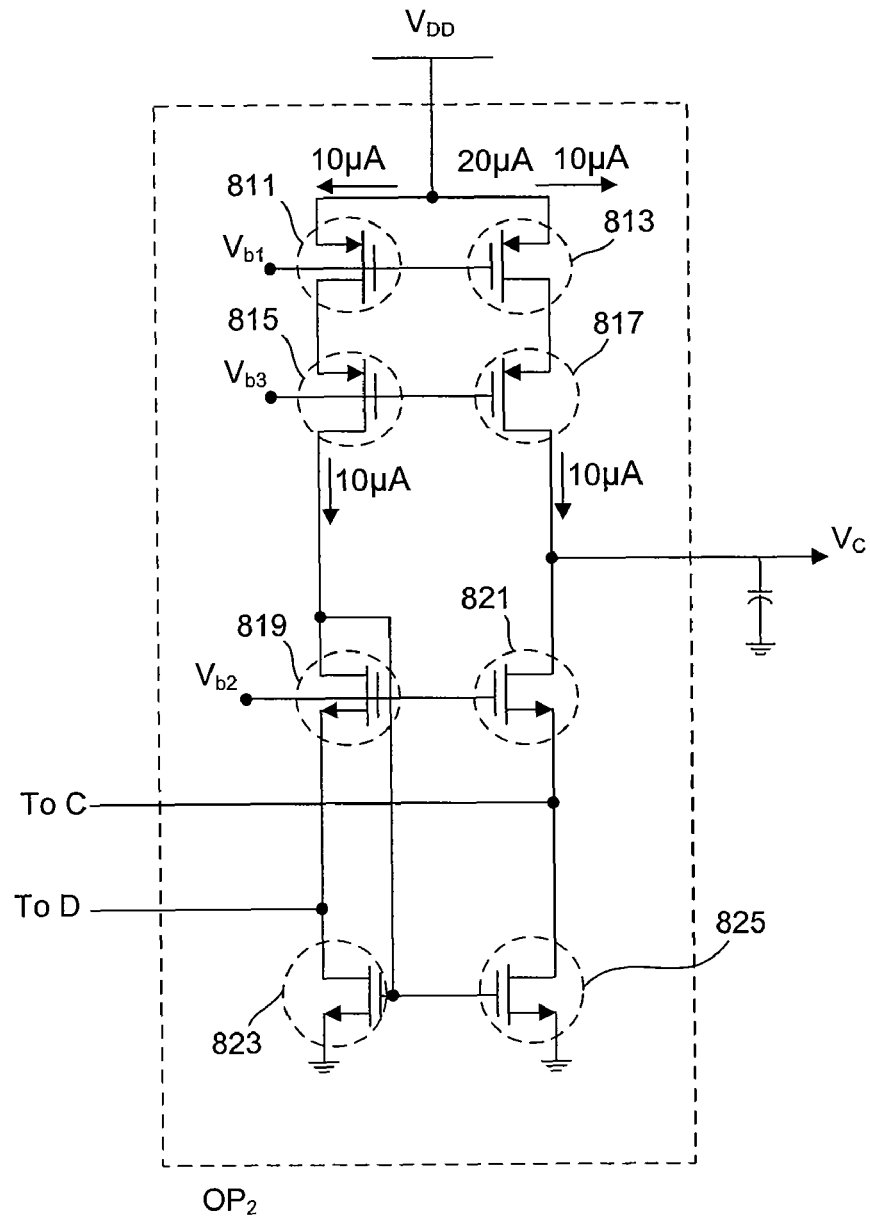

FIGS. 8A and 8B are example operational amplifiers included in the control circuits of FIGS. 6 and 7.

Figure 9:
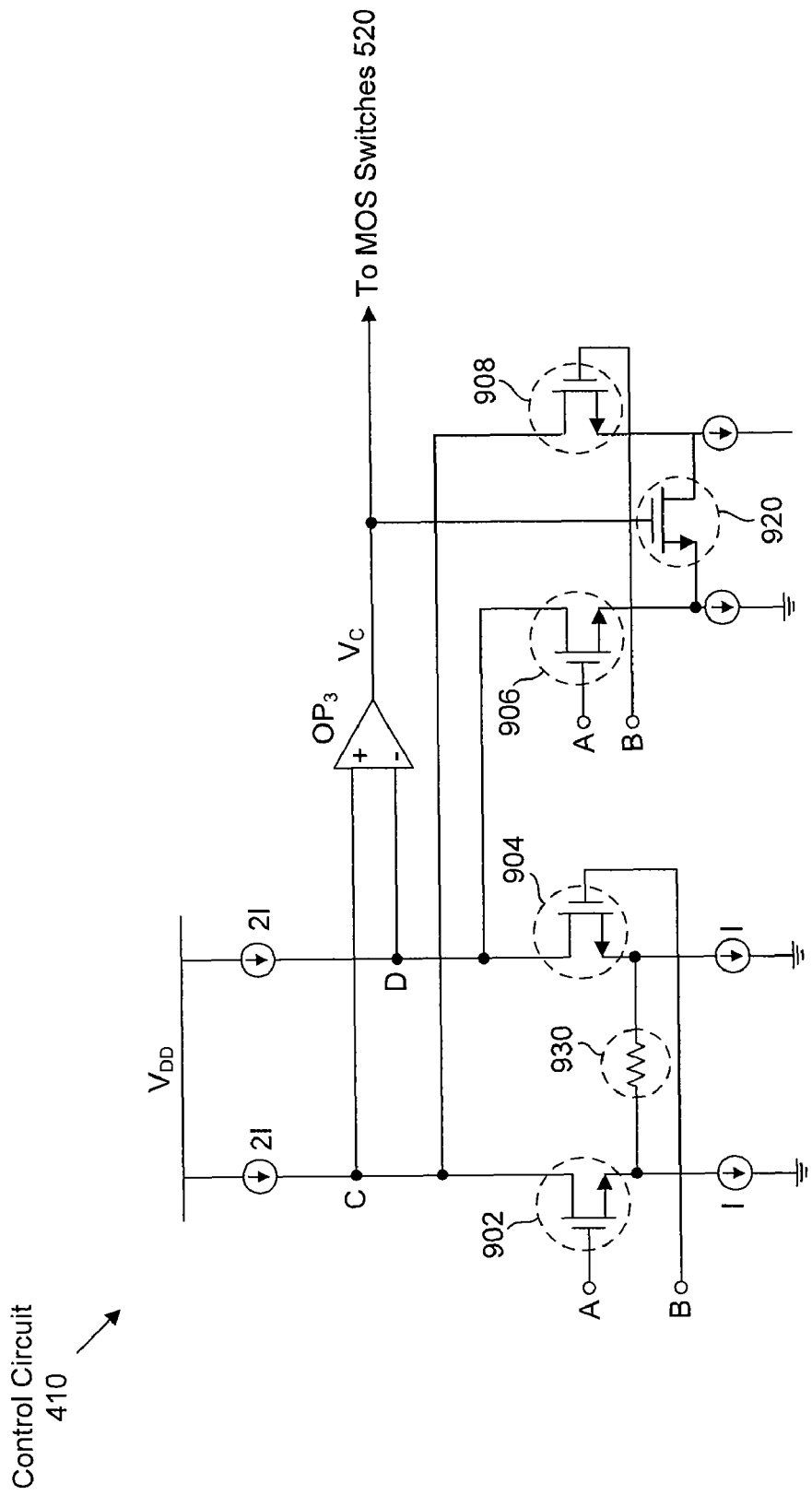

FIG. 9 is a diagram of a third embodiment of the control circuit of FIG. 4.

Figure 10:
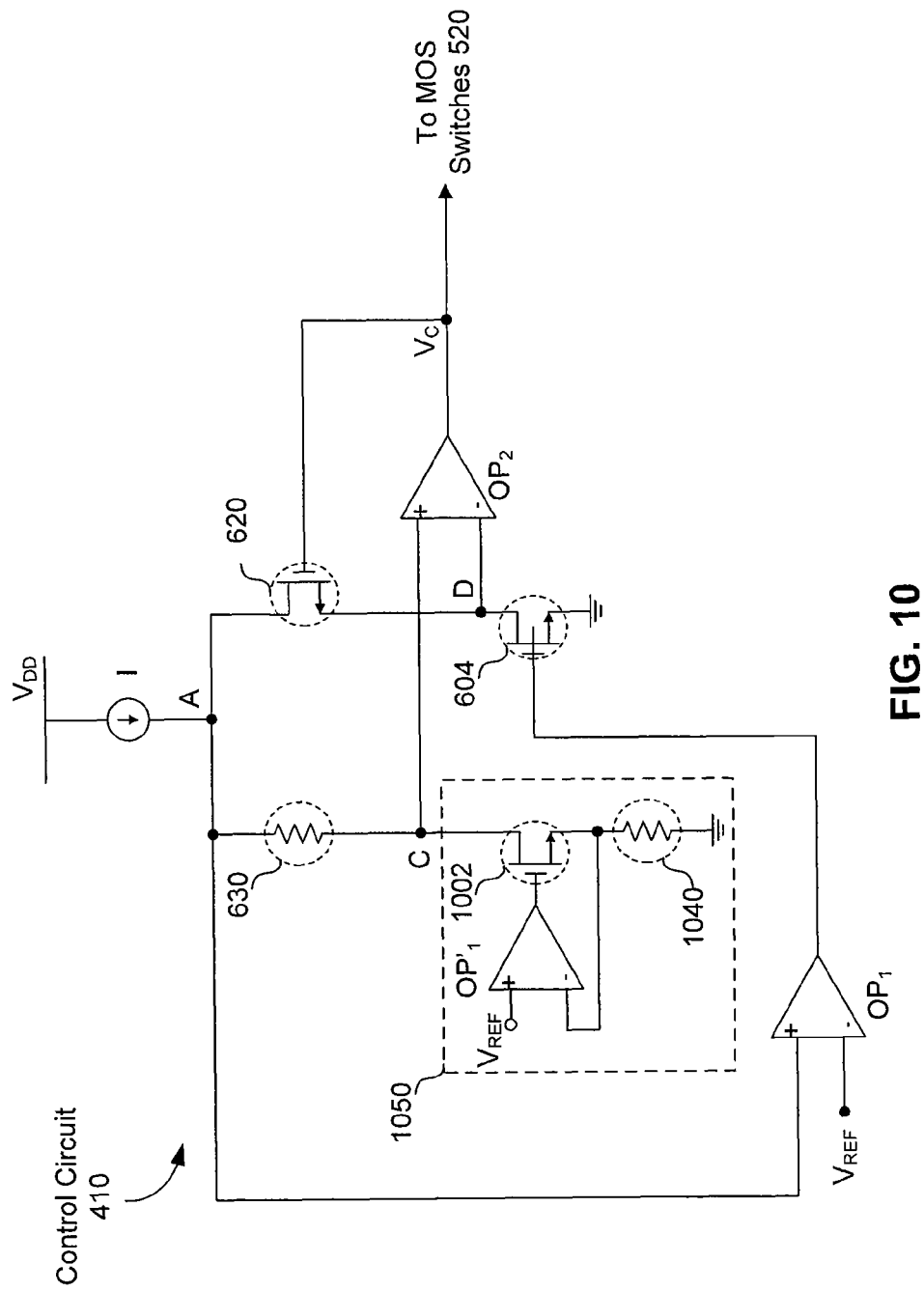

FIG. 10 is a diagram of a fourth embodiment of the control circuit of FIG. 4.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Overview

The present invention is directed to a filter having controlled MOS switches and applications thereof. Through out this document, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In an embodiment, a filter includes MOS switches rather than bulky resistors (which may occupy approximately 20% of the area in conventional filters). A gate voltage provided to each MOS switch is accurately controlled, enabling the resistance of each MOS switch to track the resistance of a reference resistor over process, voltage, and temperature variations. An additional circuit is added to the filter to provide the control voltage to the gate of each MOS switch. In an embodiment, the additional circuit consumes only approximately 90 µA, while enabling the overall area of the filter to be reduced by approximately 20% (since the bulky resistors of conventional filters are replaced with smaller MOS switches).

Further details of an example filter in accordance with an embodiment of the present invention are described below. Before describing these details, however, it is helpful to describe an example device in which such a filter may be implemented. In the description that follows, a filter in accordance with an embodiment of the present invention is described in the context of a particular kind of device: a mobile telephone. This is for illustrative purposes only, and not limitation. A person skilled in the relevant art(s) will appreciate that a filter having controlled MOS switches may be used in other types of devices that would have conventionally used bulky resistors (such as, for example, a cable modem, an embedded device, or the like), thereby enabling these other types of devices to realize the area-reducing benefits provided by the controlled MOS switches of embodiments of the present invention.

II. An Example Device

In an embodiment, a mobile telephone includes an RF chip with one or more filters having controlled MOS switches, enabling the RF chip to have a reduced area footprint compared to conventional RF chips which use bulking resistors. FIGS. 3A and 3B respectively illustrate an example transmit path 300 and an example receive path 350 of such a mobile telephone.

A. An Example Transmit Path

Transmit path 300 prepares a voice signal for transmission to another telephone or device. Referring to FIG. 3A, transmit path 300 includes a microphone 302, an analog-to-digital (A/D) converter 304, a signal processor 306, a speech encoder 308, a channel encoder 310, a modulator 312, an RF module 314, and an antenna 316.

Microphone 302 receives a near-end user's voice and outputs a corresponding audio signal. The A/D converter 304 converts the audio signal from an analog to a digital form. Signal processor 306 performs typical signal processing—including, for example, noise suppression, noise cancellation, voice-activity detection, and the like. Speech encoder 308 converts the output of signal processor 306 into a channel index. The particular format that speech encoder 308 uses to encode the signal is dependent upon the type of technology being used. For example, the signal may be encoded in formats that comply with GSM (Global Standard for Mobile Communication), CDMA (Code Division Multiple Access), or other technologies used for telecommunication.

Channel encoder 310 reduces bit errors that can occur after the signal is processed through the speech encoder 308. For example, channel encoder 310 may add redundant bits to the signal, as done in typical GSM technology. In a GSM telephone, for example, a typical bit rate at the output of speech encoder 308 may be approximately 13 kilobits per second (kb/sec); whereas a typical bit rate at the output of channel encoder 310 may be approximately 22 kb/sec. The extra bits that are present in the signal after channel encoding do not carry information about the speech. Rather, these bits make the signal more robust to help reduce bit errors.

The modulator 312 combines the digital signals from channel encoder 310 into symbols to provide an analog wave form. RF module 314 translates the analog wave forms into radio frequencies. The RF-frequency signals are then transmitted via antenna 316.

B. An Example Receive Path

Receive path 350 processes a received signal for presentation to a user. Referring to FIG. 3B, receive path 350 includes an antenna 318, an RF module 320, a demodulator 322, a channel decoder 324, a speech decoder 326, a digital to analog (D/A) converter 328, and a loud speaker 330.

During operation, an analog RF signal is received by antenna 318. RF module 320 translates the frequencies of RF signal into baseband frequencies. In an embodiment (described in greater detail below), filters of RF module 320 include MOS switches, rather than bulky resistors that are included in conventional RF modules. Because filters of RF module 320 may include MOS switches rather than bulky resistors, RF module 320 may be configured to have a smaller area footprint compared to conventional RF modules. Demodulator 322 converts analog waveforms into a digital signal. Channel decoder 324 decodes the digital signal back into the channel index, which speech decoder 326 converts back into digitized speech. D/A converter 328 converts the digitized speech into analog speech. Lastly, loud speaker 330 converts the analog speech signal into a sound pressure wave so that it can be heard by an end user.

III. An Example RF Module

As mentioned above, in an embodiment RF module 320 includes MOS switches, rather than the type of bulky resistors included in conventional RF modules. By including MOS switches rather than bulky resistors, RF module 320 occupies less area (e.g., approximately 20% less area) than a conventional RF module. An additional control circuit of RF module 320 provides a control voltage to each MOS switch, enabling the resistance of each MOS switch to track the resistance of a reference resistor over process, voltage, and temperature variations.

FIG. 4 illustrates example details of RF module 320 in accordance with an embodiment of the present invention. Referring to FIG. 4, RF module 320 has a plurality of filters, including a first filter 430A through an N-th filter 430N. The plurality of filters 430 may be organized in parallel (as illustrated in FIG. 4), in series, or a combination of both. For example, each filter 430 may represent a single stage of a multi-stage filter, and RF module 320 may include one or more multi-stage filters (e.g., an I-channel multi-stage filter and a Q-channel multi-stage filter). Each filter 430 includes a signal-path filter 402 (which is configured to filter a signal) and a DC-cancellation loop 404 (which is configured to reduce (substantially cancel) a DC component of the signal).

Each DC-cancellation loop 404 is configured as a high-pass filter and includes a MOS switch rather than a bulky resistor. The MOS switch sets the cut-off frequency of the high-pass filter. A control circuit 410 provides a control voltage, $V_C$, to the MOS switches of each DC-cancellation loop 404.

FIG. 5 illustrates example details of signal-path filter 402 and DC-cancellation loop 404 included in each filter 430. By comparing FIG. 2 to FIG. 5, it is seen that signal-path filter 402 is substantially the same as signal-path filter 102 of FIG. 2. Unlike the signal-path filters, however, DC-cancellation loop 404 of FIG. 5 is different than DC-cancellation loop 104 of FIG. 2. In particular, DC-cancellation loop 404 of FIG. 5 includes MOS switches 520A, B rather than resistors $R_{1hp}$, enabling DC-cancellation loop 404 of FIG. 5 to occupy less area than DC-cancellation loop 104 of FIG. 2. The voltage, $V_C$, applied to the gate of each MOS switch 520 is provided by control circuit 410.

IV. Example Control Circuits

In order to provide an accurate cut-off frequency for the high-pass filter of each DC-cancellation loop 404, the resistance of MOS switches 520 should follow resistors $R_f$ and $R_1$ of signal-path filter 402. In other words, as resistors $R_f$ and $R_1$ vary with process, voltage, and temperature, MOS switches 520 should vary in substantially the same way. Since the resistance of a MOS switch in the triode region is a function of gate voltage, the gate voltage of MOS switches 520 is accurately controlled based on the control voltage, $V_C$, provided by control circuit 410. In fact, control circuit 410 is configured so that the control voltage, $V_C$, causes the resistance of each MOS switch 520 to track the resistance of a reference resistor over process, voltage, and temperature variations. The reference resistor is made of (substantially) the same material and by (substantially) the same process as resistors $R_f$ and $R_1$ of signal-path filter 402. As a result, the control voltage, $V_C$, also causes the resistance of each MOS switch 520 to track the resistance of resistors $R_f$ and $R_1$ over process, voltage, and temperature variations. Several embodiments of control circuit 410 are described below.

A. A First Embodiment of Control Circuit 410

FIG. 6 illustrates a first embodiment of control circuit 410. In the embodiment of FIG. 6, control circuit 410 includes a MOS switch 620, a reference resistor 630, a first operational amplifier (op-amp) $OP_1$, a second op-amp $OP_2$, and two additional switches (switch 602 and switch 604). First op-amp $OP_1$ sets the voltage at node A equal to $V_{ref}$. Switch 602 and switch 604 have the same voltage applied to their gates and have (substantially) the same drain-to-source resistance. Because (substantial) current does not flow through first op-amp $OP_1$, and because switch 602 and switch 604 have (substantially) the same drain-to-source resistance, the current flowing through reference resistor 630 and MOS switch 620 is (substantially) the same. Second op-amp $OP_2$ forces nodes C and D to have the same potentials (voltages) by controlling $V_C$. As a result, second op-amp $OP_2$ sets the control voltage, $V_C$, so that the resistance of MOS switch 620 equals the resistance of reference resistor 630—even as the resistance of reference resistor 630 varies over process, voltage, and temperature.

Importantly, reference resistor 630 is made with (substantially) the same materials and by (substantially) the same process as resistors $R_1$ and $R_f$ of signal-path filter 402. As a result, the control voltage, $V_C$, provided to MOS switch 620 also causes the resistance of this switch to track the resistance of resistors $R_1$ and $R_f$ as their resistances vary with process, voltage, and temperature. The control voltage, $V_C$, is also provided to the gate of each MOS switch in DC-cancellation loops 404 of RF module 320 (e.g., MOS switches 520 of FIG. 5), causing the resistance of each of these MOS switches to also track the resistance of reference resistor 630, resistor $R_1$, and resistor $R_f$ over process, voltage, and temperature variations.

B. A Second Embodiment of Control Circuit 410

FIG. 7 illustrates a second embodiment of control circuit 410. Rather than including only one MOS switch and only one reference resistor (like the embodiment of FIG. 6), in the embodiment of FIG. 7 control circuit 410 includes two MOS switches (a first MOS switch 720A and a second MOS switch 720B) and two reference resistors (a first reference resistor 730A and a second reference resistor 730B). Unlike the embodiment of FIG. 6, in this embodiment the reference voltage, $V_{ref}$, provided by first op-amp $OP_1$ is set at nodes E and F, such that the voltage at nodes A and B is $V_{ref}$ plus $\Delta V$ (i.e., the voltage drop across first reference resistor 730A and across first MOS switch 720A). Like the embodiment of FIG. 6, in the embodiment of FIG. 7, the current flowing through reference resistors 730 and MOS switches 720 is (substantially) the same. Similarly, second op-amp $OP_2$ forces nodes C and D to have the same potentials (voltages) by controlling V. As a result, second op-amp $OP_2$ sets the control voltage, $V_C$, so that the combined resistance of MOS switches 720 equals the combined resistance of reference resistors 730—even as the combined resistance of reference resistors 730 varies over process, voltage, and temperature. Reference resistor 730 is made with (substantially) the same materials and by (substantially) the same process as resistors $R_1$ and $R_f$ of signal-path filter 402. The control voltage, $V_C$, may be provided to the gate of each MOS switch in DC-cancellation loops 404 of RF module 320 (e.g., MOS switches 520 of FIG. 5), causing the resistance of each of these MOS switches to also track the combined resistance of reference resistors 730, resistor R1, and resistor $R_f$ over process, voltage, and temperature variations.

FIGS. 8A and 8B respectively illustrate example circuit implementations of first op-amp $OP_1$ and second op-amp $OP_2$ used in the embodiments of FIGS. 6 and 7. Referring to FIG. 8A, first op-amp $OP_1$ includes switches 803, 805, 807, and 809. Switch 801 provides biasing to first op-amp $OP_1$. In this embodiment, first op-amp $OP_1$ may be configured to consume only approximately 20 µA of current. Referring to FIG. 8B, second op-amp $OP_2$ includes switches 811, 813, 815, 817, 819, 821, 823, and 825. Like the embodiment of first op-amp $OP_1$ of FIG. 8A, in the embodiment of FIG. 8B second op-amp $OP_2$ may be configured to consume only approximately 20 µA of current.

C. A Third Embodiment of Control Circuit 410

FIG. 9 illustrates a third embodiment of control circuit 410. In the embodiment of FIG. 9, control circuit 410 includes: (i) a reference resistor 930 hooked up in parallel between a first switch 902 and a second switch 904; and (ii) a MOS switch 920 hooked up in parallel between a third switch 906 and a fourth switch 908. Equal currents (I) are configured to flow through first switch 902, second switch 904, third switch 906, and fourth switch 908. A feedback, including op-amp $OP_3$, provides a control voltage, $V_C$, to the gate of MOS switch 920. Like the embodiments of FIGS. 6 and 7, this feedback causes the resistance of MOS switch 920 to track the resistance of reference resistor 930—even as the resistance of reference resistor 930 varies over process, voltage, and temperature. Reference resistor 930 is made with (substantially) the same materials and by (substantially) the same process as resistors $R_1$ and $R_f$ of signal-path filter 402. The control voltage, $V_C$, may be provided to the gate of each MOS switch in DC-cancellation loops 404 of RF module 320 (e.g., MOS switches 520 of FIG. 5), causing the resistance of each of these MOS switches to also track the resistance of reference resistor 930, resistor $R_1$, and resistor $R_f$ over process, voltage, and temperature variations.

D. A Fourth Embodiment of Control Circuit 410

FIG. 10 illustrates a fourth embodiment of control circuit 410. Like the first embodiment, the embodiment of FIG. 10 includes MOS switch 620, resistor 630, first op-amp $OP_1$, second op-amp $OP_2$, and switch 604. Unlike the first embodiment, however, in the embodiment of FIG. 10 control circuit 410 includes a circuit 1050, rather than switch 602 of the embodiment of FIG. 6. Circuit 1050 includes an op-amp $OP_1'$, a switch 1002, and a second resistor 1040. In the embodiment of FIG. 10, the control voltage, $V_C$, generated by op-amp $OP_2$ is configured to cause the resistance of MOS switch 620 to be inversely proportional to the resistance of second resistor 1040, which acts as a reference in this embodiment.

For example, suppose the resistance of switch 620 is defined as $R_S$; the resistance of reference resistor 630 is defined as $R_X$; and the resistance of second resistor 1040 is defined as $R_2$. In this case, the resistance of switch 620 can be represented in the following way:

$$R_S = \frac{\left[\frac{V_{ref}}{R_2}\right] \times R_X}{1 - V_{ref}/R_2} \quad \text{(Eq. 1)}$$

Equation 1 can be rearranged in the following manner:

$$\frac{1}{R_X} + \frac{1}{R_S} = \frac{1}{\left[\frac{V_{ref}}{R_2}\right] \times R_X} \quad \text{(Eq. 2)}$$

Equation 2 can be written as follows:

$$R_S = \frac{2}{R_2} \times \left(\frac{V_{ref}}{I} \times R_X\right) \quad \text{(Eq. 3)}$$

The term in parentheses on the right side of equation 3 is equal to a constant value. Thus, the control voltage, $V_C$, provided to MOS switch 620 causes the total resistance of MOS switch 620 parallel with $R_X$ to be inversely proportional to the resistance of second resistor 1040, i.e., $R_S \propto 1/R_2$. In this case, $R_2$ is replaced by a parallel combination of switch 620 and resistor $R_X$ in parallel. The control voltage, $V_C$, makes the multiplication of the two resistors $mR_1$ and $R_{1hp}$ (which is replaced by switch 620 and $R_x$) to be constant. Consequently, the frequency characteristics of $mR_1$ and $R_{1hp}$ are constant and independent of changes in m. The control voltage, $V_C$, may also be provided to the gate of each MOS switch in DC-cancellation loops 404 of RF module 320 (e.g., MOS switches 520 of FIG. 5).

V. Example Software Implementations

In addition to hardware implementations of RF module 320 and control circuit 410, such modules and circuits may also be embodied in software disposed, for example, in a computer-readable medium configured to store the software (e.g., a computer-readable program code). The program code causes the enablement of embodiments of the present invention, including the following embodiments: (i) the functions of the systems and techniques disclosed herein; (ii) the fabrication of the systems and techniques disclosed herein (such as, the fabrication of RF module 320 and control circuit 410); or (iii) a combination of the functions and fabrication of the systems and techniques disclosed herein.

This can be accomplished, for example, through the use of general-programming languages (such as C or C++), hardware-description languages (HDL) including Verilog HDL, VHDL, Altera HDL (AHDL) and so on, or other available programming and/or schematic-capture tools (such as circuit-capture tools). The program code can be disposed in any known computer-readable medium including semiconductor, magnetic disk, or optical disk (such as CD-ROM, DVD-ROM). As such, the code can be transmitted over communication networks including the Internet and internets. It is understood that the functions accomplished and/or structure provided by the systems and techniques described above can be represented in a chip that is embodied in program code and may be transformed to hardware as part of the production of integrated circuits.

VI. Conclusion Described above are example filters having controlled MOS switches and applications thereof. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. An integrated circuit, comprising:
a signal-path filter configured to receive an input signal at an input and provide an output signal at an output;
a high-pass filter having an input coupled to the output of the signal path filter and an output coupled to the input of the signal path filter, and configured to reduce a direct-current (DC) component of the input signal, wherein the high-pass filter comprises a metal-oxide-semiconductor (MOS) switch, and wherein a corner frequency of the high-pass filter is based on a resistance of the MOS switch; and
a control circuit that includes a reference resistor, and is configured to provide a control voltage to the MOS switch that is determined based on a resistance of the reference resistor, and wherein the control voltage determines the resistance of the MOS switch so that the resistance of the MOS switch substantially tracks changes in the resistance of the reference resistor.

2. The integrated circuit of claim 1, further comprising:
one or more additional signal-path filters, each configured to receive an additional input signal at a corresponding input and provide an additional output signal at a corresponding output; and
one or more additional high-pass filters, each additional high-pass filter coupled to a corresponding additional signal-path filter so that its respective input is coupled to the output of the corresponding additional signal path filter and its respective output is coupled to the input of the corresponding additional signal path filter, and wherein each additional high pass filter is configured to reduce a DC component of the additional input signal of the corresponding additional signal-path filter, each additional high-pass filter comprising a MOS switch, wherein a corner frequency of each additional high-pass filter is based on a resistance of the MOS switch included in each additional high-pass filter.

3. The integrated circuit of claim 2, wherein the control circuit is configured to provide the control voltage to the MOS switch of each additional high-pass filter.

4. The integrated circuit of claim 3, wherein the resistance of the MOS switch of each additional high-pass filter substantially tracks the resistance of the reference resistor.

5. The integrated circuit of claim 1, wherein the control circuit further comprises a second MOS switch, and wherein a resistance of the second MOS switch substantially tracks the resistance of the reference resistor.

6. The integrated circuit of claim 1, wherein the control circuit further comprises a second resistor and is further configured so that the control voltage provided to the MOS switch causes the resistance of the MOS switch to be substantially a multiplicative inverse of the resistance of the second resistor.

7. A device, comprising:
a receiver input that receives an input signal; and
a filter that filters the input signal, wherein the filter comprises:
a signal-path filter configured to receive the input signal at an input and provide an output signal at an output;
a high-pass filter having an input coupled to the output of the signal path filter and an output coupled to the input of the signal path filter, and configured to reduce a direct-current (DC) component of the input signal, wherein the high-pass filter comprises a metal-oxide-semiconductor (MOS) switch, and wherein a corner frequency of the high-pass filter is based on a resistance of the MOS switch; and
a control circuit that includes a reference resistor, and is configured to provide a control voltage to the MOS switch that is determined based on a resistance of the reference resistor, and wherein the control voltage determines the resistance of the MOS switch so that the resistance of the MOS switch substantially tracks changes in the resistance of the reference resistor.

8. The device of claim 7, wherein the filter further comprises:
one or more additional signal-path filters, each configured to receive an additional input signal at a corresponding input and provide an additional output signal at a corresponding output; and
one or more additional high-pass filters, each additional high-pass filter coupled to a corresponding additional signal-path filter so that its respective input is coupled to the output of the corresponding additional signal path filter and its respective output is coupled to the input of the corresponding additional signal path filter, and wherein each additional high pass filter is configured to reduce a DC component of the additional input signal of the corresponding additional signal-path filter, each additional high-pass filter comprising a MOS switch, wherein a corner frequency of each additional high-pass filter is based on a resistance of the MOS switch included in each additional high-pass filter.

9. The device of claim 8, wherein the control circuit is configured to provide the control voltage to the MOS switch of each additional high-pass filter.

10. The device of claim 9, wherein the resistance of the MOS switch of each additional high-pass filter substantially tracks the resistance of the reference resistor.

11. The device of claim 7, wherein the control circuit further comprises a second MOS switch, and wherein a resistance of the second MOS switch substantially tracks the resistance of the reference resistor.

12. The device of claim 7, wherein the control circuit further comprises a second resistor and is further configured so that the control voltage provided to the MOS switch causes the resistance of the MOS switch to be substantially a multiplicative inverse of the resistance of the second resistor.

13. A computer-program product comprising a computer-readable storage medium containing instructions that, if executed on a computing device, define an integrated circuit (IC), wherein the IC comprises:
a signal-path filter configured to receive an input signal at an input and provide an output signal at an output;
a high-pass filter having an input coupled to the output of the signal path filter and an output coupled to the input of the signal path filter, and configured to reduce a direct-current (DC) component of the input signal, wherein the high-pass filter comprises a metal-oxide-semiconductor (MOS) switch, and wherein a corner frequency of the high-pass filter is based on a resistance of the MOS switch; and a control circuit that includes a reference resistor, and is configured to provide a control voltage to the MOS switch that is determined based on a resistance of the reference resistor, and wherein the control voltage determines the resistance of the MOS switch so that the resistance of the MOS switch substantially tracks changes in the resistance of the reference resistor.

14. The computer-program product of claim 13, wherein the IC further comprises:

one or more additional signal-path filters, each configured to receive an additional input signal at a corresponding input and provide an additional output signal at a corresponding output; and one or more additional high-pass filters, each additional high-pass filter coupled to a corresponding additional signal-path filter so that its respective input is coupled to the output of the corresponding additional signal path filter and its respective output is coupled to the input of the corresponding additional signal path filter, and wherein each additional high pass filter is configured to reduce a DC component of the additional input signal of the corresponding additional signal-path filter, each additional high-pass filter comprising a MOS switch, wherein a corner frequency of each additional high-pass filter is based on a resistance of the MOS switch included in each additional high-pass filter.

15. The computer-program product of claim 14, wherein the control circuit is configured to provide the control voltage to the MOS switch of each additional high-pass filter.

16. The computer-program product of claim 15, wherein the resistance of the MOS switch of each additional high-pass filter substantially tracks the resistance of the reference resistor.

17. The computer-program product of claim 13, wherein the control circuit further comprises a second MOS switch, and wherein a resistance of the second MOS switch substantially tracks the resistance of the reference resistor.

18. The computer-program product of claim 13, wherein the control circuit further comprises a second resistor and is further configured so that the control voltage provided to the MOS switch causes the resistance of the MOS switch to be substantially a multiplicative inverse of the resistance of the second resistor.

\* \* \* \* \*